US008434051B2

(12) United States Patent
Koyuncu et al.

(10) Patent No.: US 8,434,051 B2
(45) Date of Patent: Apr. 30, 2013

(54) SCHEMATIC WIRE ANNOTATION TOOL

(75) Inventors: Kutalmis Koyuncu, Poughkeepsie, NY (US); David Webber, Poughkeepsie, NY (US); Michael H. Wood, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 373 days.

(21) Appl. No.: 12/557,855

(22) Filed: Sep. 11, 2009

(65) Prior Publication Data
US 2011/0066996 A1    Mar. 17, 2011

(51) Int. Cl.
*G06F 17/50* (2006.01)
*G06F 9/455* (2006.01)

(52) U.S. Cl.
USPC ........... 716/139; 716/100; 716/101; 716/102; 716/103; 716/104

(58) Field of Classification Search .......... 716/100–104, 716/139, 126, 129–130
See application file for complete search history.

(56) References Cited

U.S. PATENT DOCUMENTS

| | | | | |
|---|---|---|---|---|
| 6,546,529 B1* | 4/2003 | Dansky et al. | ................. | 716/115 |
| 7,013,028 B2* | 3/2006 | Gont et al. | .................... | 382/113 |
| 7,657,852 B2* | 2/2010 | Waller | ........................ | 716/119 |
| 7,735,036 B2* | 6/2010 | Dennison et al. | ............. | 716/106 |
| 7,861,193 B2* | 12/2010 | Meserve | ....................... | 716/102 |

* cited by examiner

*Primary Examiner* — Nghia Doan
(74) *Attorney, Agent, or Firm* — Cantor Colburn LLP; William A. Kinnaman, Jr.

(57) ABSTRACT

A method of automating circuit design is provided and includes storing one or more circuit design schematics in a memory, providing, by way of an interface, a plurality of search parameters for searching for nets of the schematics in the memory, searching for nets of the schematics in the memory in accordance with search parameters input into the interface and presenting, by way of the interface, information associated with a net matching the received search parameters.

20 Claims, 2 Drawing Sheets

SCHEMATIC WIRE ANNOTATION TOOL

BACKGROUND

Figure 1:
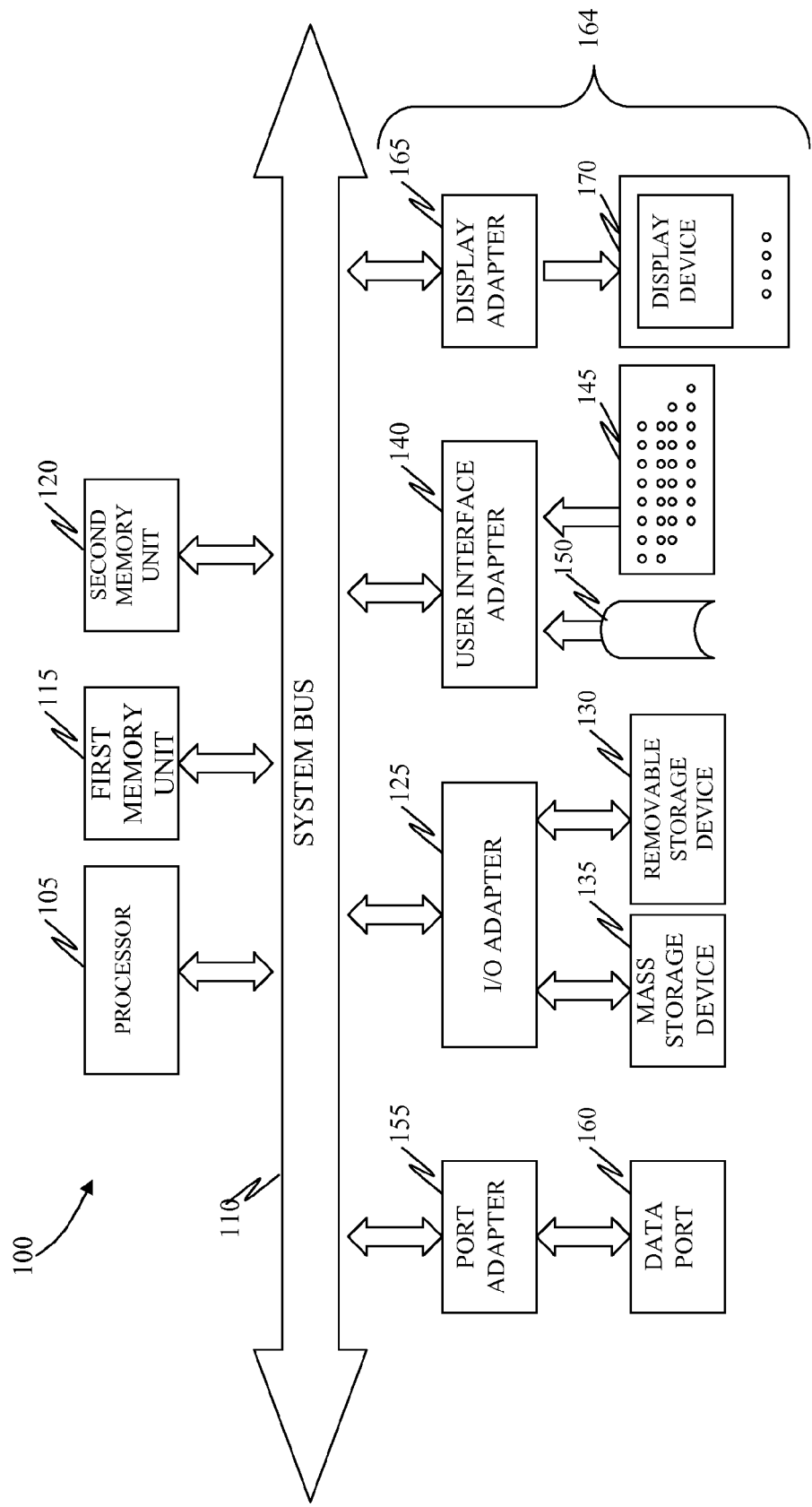

Aspects of the present invention are directed to a schematic wire annotation tool for use in the design of integrated circuits and the design of interconnections between components.

An electrical network is an interconnection of electrical elements such as resistors, inductors, capacitors, transmission lines, voltage sources, current sources, and switches. An electrical circuit is a network that has a closed loop, giving a return path for the current. A network is a connection of two or more components, and may not necessarily be a circuit.

In designing an electrical circuit, it is typically necessary to optimize components and wire interconnects to achieve timing goals. With increasingly dense integrated circuits, the metal interconnects (wires) between components plays a more important role in determining speed of the circuits. One important aspect of circuit timing optimization is to assign to critical wires an appropriate width, spacing and metal layer. Early in the design, however, it is difficult to determine which nets are critical.

A common solution to timing problems is to use wide wires and wide spaces to improve the delay of the electrical signal through the interconnections. This also improves transition times of the signals on the wires and delays through components connected to the wire. Because wide wires and spaces add to routing congestion it is desirable to use minimal wire and spacing when possible and to restrict the use of wide wires and wide spacing for timing critical connections.

Known solutions to the problem of verifiably achieving optimal circuit timing with respect to wire widths, spacing and levels generally involve manual analyses of the nets in the schematic of an electrical circuit. A drawback of this approach is that it requires a significant investment of time and effort. Often multiple iterations of this manual flow are required to converge on a design that meets timing requirements.

SUMMARY

In accordance with an aspect of the invention, a method of automating circuit design is provided and includes storing one or more circuit design schematics in a memory, providing, by way of an interface, a plurality of search parameters for searching for nets of the schematics in the memory, searching for nets of the schematics in the memory in accordance with search parameters input into the interface and presenting, by way of the interface, information associated with a net matching the received search parameters.

The search parameters used to identify critical nets are the number of components connected together on a wire (fanout), the total length of the wire, and the size of the component driving the wire. An additional search parameter is the type of net. Net types can be identified by net name, or other classification such as clock or output nets.

In accordance with another aspect of the invention, a method of automating circuit design is provided and includes storing one or more circuit design schematics in a memory, searching, in accordance with user inputted search parameters, for nets of the schematics, presenting, to the user, information associated with a net matching the search parameters, editing, in accordance with user inputted edit commands, the net and updating the one or more of the circuit design schematics associated with the net to include the edited net.

In accordance with an aspect of the invention, a system for use in automating circuit design is provided and includes a first memory unit on which one or more circuit design schematics are storable, a display unit to display an interface by which a plurality of search parameters for searching for nets of the schematics in the memory are receivable and a processor, coupled to a second memory unit having executable instructions stored thereon, which, when executed, cause the processor to be receptive of a search command and to search for nets of the schematics in the first memory in accordance with received search parameters, wherein the display unit further presents information associated with a net matching the received search parameters in the interface.

BRIEF DESCRIPTIONS OF THE SEVERAL VIEWS OF THE DRAWINGS

Figure 2:
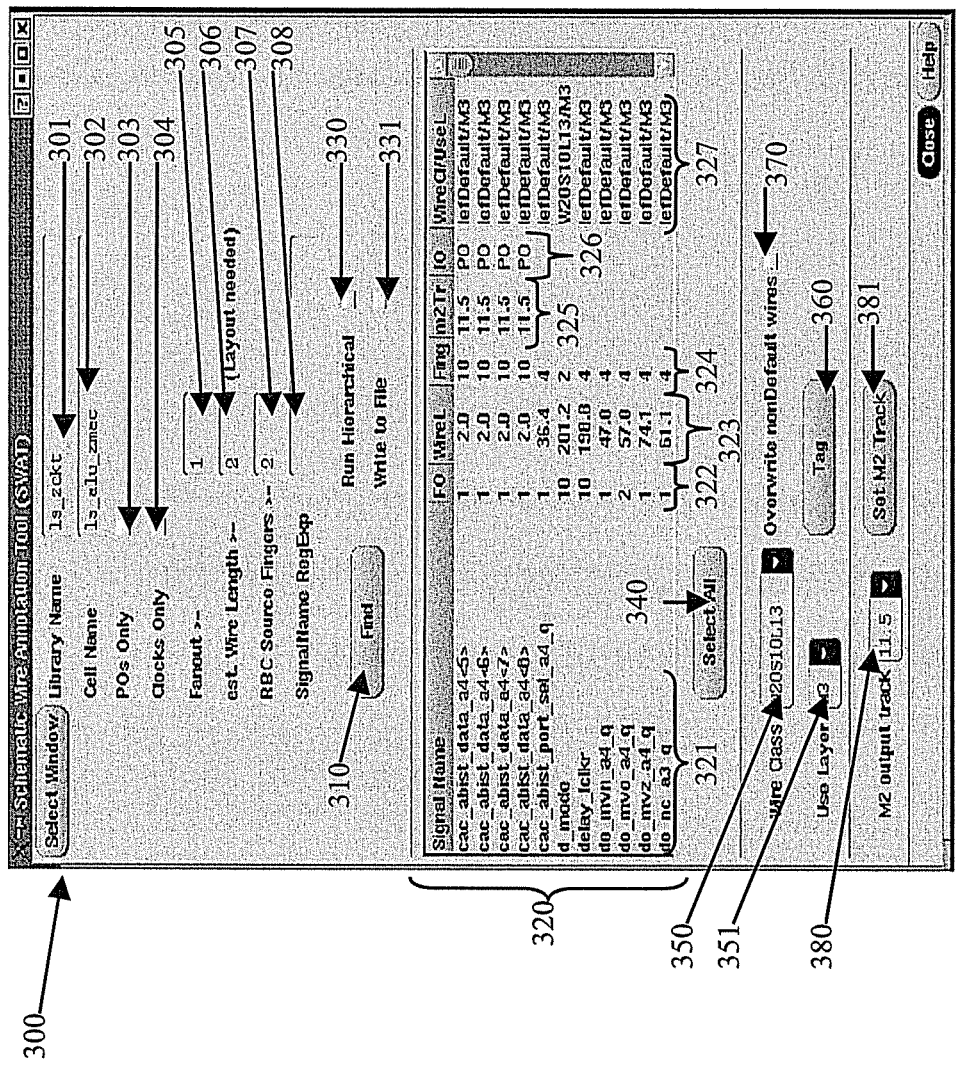

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

FIG. 1 is a schematic of a system for use in automating circuit design in accordance with embodiments of the present invention; and FIG. 2 is a screenshot of a schematic wire annotation tool in accordance with embodiments of the present invention.

DETAILED DESCRIPTION

In accordance with aspects of the invention, nets in a circuit schematic are to be tagged once others in the schematic that do not meet a certain set of criteria are filtered out. The advantage of this approach is that a manual process is automated and time is saved. As will be described below, nets in the schematic can be filtered out in accordance with various parameters including, but not limited to fanout, wire length, driver size and name. Once the non-matching nets are filtered out and the candidate nets are found, a user or some other entity can select the nets of interest and tag all selected nets at once with for example a desired wire class and/or use layer.

With reference to FIG. 1, a system 100, such as a computing device, is provided for use in automating circuit design. The system 100 includes at least first and second memory units 115 and 120, a display unit 164 and a processor 105. One or more circuit design schematics are storable with respect to the first memory unit 114. The display unit 164 is configured to display a first user interface 200 (see FIG. 2) by which a plurality of search parameters for searching for nets of the schematics in the memory unit 114 are receivable. The processor 105 is coupled to the second memory unit 120. The second memory unit 120 has executable instructions stored thereon, which, when executed, cause the processor 105 to be receptive of a search command via for example the first user interface 200, and, upon such reception, to search for nets of the schematics in the first memory unit 114 in accordance with received search parameters. The display unit 164 further presents, in a second user interface 250 and, as a result of the searching, information associated with a net matching the received search parameters.

As shown in the FIG. 1, the system 100 may further include a system bus 110 to which the processor 105, the first and second memory unit 115 and 120 and the display unit 164 are coupled. The system 100 may further include a port adapter 155, by which a data port 160 is coupled to the system bus 110, an input/output (I/O) adapter 125, by which a mass storage device 135 and a removable storage device 130 are coupled to the system bus 110, a user interface adapter 140, by which user devices 150 and 145 are coupled to the system bus 110 and a display adapter 165. The display adapter 165 serves to couple a display device 170 of the display unit 164 to the system bus 110.

With this or a similar configuration and, with reference to FIG. 2, the first and second user interfaces 200 and 250 may be embodied in a form 300, a screenshot of which is provided, that allows a user to control the execution of code or executable instructions of an annotation tool stored in the first and/or second memory units 115 and 120.

As shown in FIG. 2, the form 300 includes a library name field 301 and a cell name field 302 into which a user may input the library name and the cell name of the schematic to be worked on and searched through for nets of interest. The form 300 may further include PO Only and Clocks Only buttons 303 and 304. If the user wants to work only on macro outputs, the PO Only button 303 should be checked. In this case, only the output nets will be found. Similarly, if the user only wants to work on clock nets, the Clocks Only button 304 should be checked. In this case, all nets will be searched through and only the ones that are driven by a local clock block (LCB) will be found. If both buttons 303 and 304 are checked, in accordance with an embodiment of the invention, only the output nets may be found.

The form 300 may further include a fanout field 305, an estimated wire length field 306, a source finger field 307 and a signal name field 308. In some cases, an additional field may be provided by which instructions for weighing parameters entered in each of the fields can be entered. With at least fields 305-308 provided in the form 300, the user can control the execution of the code in accordance with the following explanations.

The user can specify a minimum fanout in the fanout field 305. Any net that has a fanout that is equal to or higher than the specified number will then be filtered. The fanout calculation may be done through the hierarchy of the schematic to find all the drops of each of the nets. The code works on signals so every bit on every bus is checked separately. This lets the user tag specific bits of a bus.

Also a minimum wire length can be specified by the user in the wire length field 306 so that nets with unspecified wire lengths are filtered out by the code. One important point here is that, to be able to estimate wire length, a layout view that matches that schematic is needed. The code will go through all nets in the layout, draw a boundary box around all the hierarchical instances the net is connected to and thereby estimate a wire length. If this wire length is equal to or bigger than the specified number in the field 306, the code will filter out that net. If the layout does not exist then the code will disregard the input in the wire length field 306. For a routed net, the actual wire length can be measured and used instead of the estimated wire length. Hence a mixture of routed lengths and estimated lengths can be used based on if the net is routed or not.

Further filtering can be done with driver size. Here, the user can input a minimum number of source fingers for standard gate reference library or RBC books in source finger field 307. The code will then go through all nets, find the driver books and check the number of fingers for each. It will then filter the nets that have equal to or more RBC fingers than the given number in the source finger field 306. If the Clocks Only button 304 is checked, the code may ignore the input in the source finger field 307 since clocks are not driven by RBC books.

Also, the user can filter signals by name using the signal name field 308. The value of this field calls for a regular expression match and filters the signals that contain the given expression in the signal name.

Once the desired fields are filled, the user can click the Find button 310 to input a search command and the nets that meet all the user-specified requirements will be displayed in display field 320. Display field 320 may display the candidate nets along with at least one or more of a signal name 321, a fanout 322, a wire length 323, a number of fingers 324, an m2 output track 325, input/output information 326, using the term "PI" for inputs and "PO" for outputs, and a wire class/ use layer 327. If no value is entered for fanout, wire length, fingers and signal name in the form 300, the code will treat the search as if the minimum requirement is zero and show all nets without any filtering for those parameters.

The form 300 may further include a Run Hierarchical button 330 that instructs the code to run the search in hierarchical mode and a Write-to-File button 331 that instructs the code to automatically write the search results to a file. In hierarchical mode, the code will search through all cellviews in the hierarchy of at least the first memory unit 114 and filter nets that meet the given criteria. The hierarchical signals for example will be displayed with the signal name and the cellview they are found in. In the Write-to-File mode, the code creates a file with the cellview name and puts it in for example a Schematic Wire Annotation Tool (SWAT) directory in the user's home directory.

The user may also select one or multiple nets or click the Select All button 340 to select all of the displayed nets to tag. Hierarchical nets can be tagged as well. From wire class and use layer drop-down menus 350 and 351, the desired wire class and use layer can be selected. Here, various double and triple wide wire classes and use layers may be provided for the user to choose from. The defaults in these fields may be selectively set to double wide-single space wire and M3 use layer as an example.

The user may then click on the Tag button 360 to cause the code to tag the selected nets with the desired wire class and the use layer. If, however, it is determined that non-default wires are among the selected nets, the code may issue a pop-up warning message stating for example that some nets cannot be tagged and pointing out that the user to check a cadence information window (CIW), which contains the nets that have the non-default wires.

If the user still wants to tag these wires, the user should check the Overwrite nonDefault wires button 370 and then re-click the Tag button 360 again. This check procedure serves to prevent users from accidentally overwriting an existing good wire with another one. This tool can also be used to set the m2 output track on large drivers. The desired m2 track can be selected from the m3 output track drop-down menu 380 where all tracks except power and ground tracks are provided. Here, the user again selects the nets of interest from the field of nets in display field 320 and hits the Set M2 Track button 381 to set the tracks. The m2 track information in the nets field lets the user select the nets that have no m2 tracks set. The code then goes through the hierarchy, finds the driver book of that net and sets the m2 output track property on that RBC book.

Once the schematic is edited through the form 300, a new layout can be generated from the updated schematic and this new layout will have the new wire properties and the m2 tracks set. Alternatively, an existing layout can be updated with the changes needed. In either case, the present invention can be implemented as a computer program that determines the fanout, wire length, and driver size of each net in the design and based on a pre-determined set of criteria will assign wire classes and metal layers to every net in the design.

The criteria include a weighted combination of fanout, wire length, driver size, timing information and signal name or signal purpose.

In accordance with another aspect of the invention, a method of automating circuit design is provided and includes storing one or more circuit design schematics in a memory, searching, in accordance with user inputted search parameters, through the memory for nets of the schematics, presenting to the user information associated with a net matching the search parameters, editing, in accordance with user inputted edit commands, the net, and updating the one or more of the circuit design schematics associated with the net to include the edited net.

In accordance with the aspects of the invention discussed herein, the methods described above may be embodied as a computer readable medium having executable instructions stored thereon. When executed, the executable instructions cause the processor 105 of the system 100 to execute the methods.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. A method of automating circuit design, the method comprising:
    storing one or more circuit design schematics in a memory;
    providing, by way of an interface, a plurality of search parameters for searching for nets of the schematics in the memory by a given size of net fanout, a given net wirelength, a given net driver size and a given net name;
    searching for nets of the schematics in the memory to match with every search parameter respectively associated with the given size of net fanout, the given net wirelength, the given net driver size and the given net name, which are input into the interface; and
    presenting, by way of the interface, information associated with a net that matches the inputted search parameters.

2. The method according to claim 1, wherein the providing comprises displaying a field for receiving a library name associated with the one or more schematics.

3. The method according to claim 1, wherein the providing comprises displaying a field for receiving a cell name associated with the one or more schematics.

4. The method according to claim 1, wherein the providing comprises displaying a checkable button indicating that only primary output nets are to be searched for.

5. The method according to claim 1, wherein the providing comprises displaying a checkable button indicating that only clock nets are to be searched for.

6. The method according to claim 1, wherein the providing comprises at least one of:
    displaying a field for receiving an instruction to limit the searching to nets having the given fanout size;
    displaying a field for receiving an instruction to limit the searching to nets having the given net wirelength;
    displaying a field for receiving an instruction to limit the searching to nets having the given net driver size;
    displaying a field for receiving an instruction to limit the searching to nets having a given number of source fingers; and
    displaying a field for receiving an instruction to filter signals by the given net name.

7. The method according to claim 1, wherein the searching comprises searching in a hierarchical mode and/or a write-to-file mode.

8. The method according to claim 7, further comprising creating a file identifying the net that matches the inputted search parameters when the searching is conducted in the write-to-file mode.

9. The method according to claim 1, wherein the presenting comprises presenting at least one of a signal name, a fanout, a wire length, a number of fingers, an output track, input/output information and a wire class/use layer of the net that matches the inputted search parameters.

10. The method according to claim 1, further comprising allowing a user to select at least one of one or more nets that match the inputted search parameters, a wire class and a user layer to tag.

11. The method according to claim 10, further comprising issuing a warning that a net that matches the inputted search parameters to be tagged involves overwriting an existing non-default wire.

12. The method according to claim 1, further comprising:
    receiving editing information relating to the net that matches the inputted search parameters; and
    upon receipt of a storing command, editing the net and storing the edited net in the memory.

13. The method according to claim 12, further comprising updating the one or more circuit design schematics associated with the edited net.

14. The method according to claim 13, further comprising generating the updated one or more circuit design schematics including the edited net.

15. A non-transitory computer readable medium having executable instructions stored thereon, which, when executed, cause a processor of a computing device to execute the method according to claim 1.

16. A method of automating circuit design, the method comprising:
    storing one or more circuit design schematics in a memory;
    searching for nets of the schematics to match with every search parameter respectively associated with a given size of net fanout, a given net wirelength, a given net driver size and a given net name, which are inputted by a user;
    presenting information to the user, which is associated with a net matching the search parameters;
    editing the net in accordance with user inputted edit commands; and
    updating one or more of the circuit design schematics that are associated with the net to include the edited net.

17. A system for use in automating circuit design, the system comprising:
    a first memory unit on which one or more circuit design schematics are storable;
    a display unit to display an interface by which a plurality of search parameters for searching for nets of the schematics by a given size of net fanout, a given net wirelength, a given net driver size and a given net name in the first memory unit are receivable; and
    a processor, coupled to a second memory unit having executable instructions stored thereon, which, when executed, cause the processor to be receptive of a search command and to search for nets of the schematics in the first memory unit to match with every search parameter respectively associated with the given size of net fanout, the given net wirelength, the given net driver size and the given net name, wherein the display unit further presents information associated with a net matching the received search parameters in the interface.

18. The method according to claim 17, wherein, when executed, the executable instructions further cause the processor to:

receive editing information relating to the net matching the received search parameters; and upon receipt of a storing command, edit the net and store the edited net in the first memory unit.

19. The method according to claim 18, wherein, when executed, the executable instructions further cause the processor to update the one or more circuit design schematics associated with the edited net.

20. The method according to claim 19, wherein, when executed, the executable instructions further cause the processor to generate the updated one or more circuit design schematics including the edited net.

* * * * *